(12) United States Patent
Varga et al.

(10) Patent No.: US 7,266,136 B2
(45) Date of Patent: Sep. 4, 2007

(54) TEMPERATURE COMPENSATION FOR FIBER OPTIC TRANSCEIVERS USING OPTIMIZED CONVERGENCE ALGORITHMS

(75) Inventors: Laszlo Varga, Longmont, CO (US); Nelson Diaz, Westminster, CO (US); Robert Jones, Loveland, CO (US)

(73) Assignee: Finisar Corporation, Sunnyvale, CA (US)

( * ) Notice: Subject to any disclaimer, the term of this patent is extended or adjusted under 35 U.S.C. 154(b) by 320 days.

(21) Appl. No.: 10/808,944

(22) Filed: Mar. 25, 2004

(65) Prior Publication Data

US 2005/0213621 A1   Sep. 29, 2005

(51) Int. Cl.
*H01S 3/00* (2006.01)
(52) U.S. Cl. .................... 372/38.02; 372/29.01
(58) Field of Classification Search ............. 372/38.02, 372/38.07, 38.01, 26, 29.011, 36
See application file for complete search history.

(56) References Cited

U.S. PATENT DOCUMENTS

| | | | |
|---|---|---|---|
| 5,043,992 A | 8/1991 | Royer et al. | |
| 6,229,832 B1* | 5/2001 | Baba et al. | 372/38.01 |
| 6,292,497 B1* | 9/2001 | Nakano | 372/29.015 |
| 6,795,458 B2* | 9/2004 | Murata | 372/26 |
| 6,891,866 B2* | 5/2005 | Robinson et al. | 372/29.015 |
| 2002/0141466 A1 | 10/2002 | Martinez et al. | |

* cited by examiner

*Primary Examiner*—Minsun Oh Harvey
*Assistant Examiner*—Tuan N. Nguyen
(74) *Attorney, Agent, or Firm*—Workman Nydegger

(57) ABSTRACT

A temperature compensation system comprises a laser driver having a first potentiometer, the laser driver configured to provide a first signal to a laser based on a value of the first potentiometer and an optical communication analyzer configured to provide a second signal indicative of a first output parameter of the laser. The temperature compensation system comprises a computer system configured to drive the first signal and receive the second signal and determine a first updated value for the first potentiometer to obtain a first desired laser output parameter value based on a first known value of the first potentiometer, the second signal, and the first desired laser output parameter value.

24 Claims, 6 Drawing Sheets

TEMPERATURE COMPENSATION FOR FIBER OPTIC TRANSCEIVERS USING OPTIMIZED CONVERGENCE ALGORITHMS

BACKGROUND

Fiber optic transceivers are used in a variety of applications, including storage area networks (SANs), local area networks (LANs), Fibre Channel, Gigabit Ethernet, and synchronous optical network (SONET) applications. Fiber optic transceivers can be used as the network interface in mainframe computers, workstations, servers, and storage devices. Fiber optic transceivers can also be used in a broad range of network devices, such as bridges, routers, hubs, and local and wide area switches.

Fiber optic transceivers include a fiber optic receiver and a fiber optic transmitter. The fiber optic receiver converts optical serial data to electrical serial data and the fiber optic transmitter converts electrical serial data to optical serial data. A majority of fiber optic transceivers include power control circuits, diagnostic circuits, and other circuits for enhancing the functionality of the fiber optic transceivers.

Fiber optic transmitters include a transmitter optical subassembly (TOSA). Typically, TOSAs include a laser diode and a monitor diode. Temperature variations during operation of TOSAs affect the tracking error (TE) and the slope efficiency (SE) of the TOSAs. These variations may vary from TOSA to TOSA. This may require an individual temperature compensation of each TOSA for each fiber optic transceiver.

Average power ($P_{ave}$) and extinction ration (ER) vary with temperature due to laser parameter changes over temperature. $P_{ave}$ can be controlled by varying the setting of a first potentiometer that changes the bias current to the laser diode as the temperature changes. ER can also be controlled over temperature by varying the setting of a second potentiometer that changes the modulation current as the temperature changes.

All lasers do not behave identically; therefore one temperature compensation curve for the first potentiometer and a one temperature compensation curve for the second potentiometer cannot be used to compensate for all lasers. Typically, the values for the first potentiometer and the second potentiometer are found by iteratively searching for values to provide the desired $P_{ave}$ and ER at every few degrees within the operating temperature range of the laser. Interpolation between the values is used to create a profile or curve for the first potentiometer and the second potentiometer that can be determined to keep $P_{ave}$ and ER within specification.

SUMMARY

One embodiment of the invention provides a temperature compensation system for a laser. The temperature compensation system comprises a laser driver having a first potentiometer, the laser driver configured to provide a first signal to a laser based on a value of the first potentiometer and an optical communication analyzer configured to provide a second signal indicative of a first output parameter of the laser. The temperature compensation system comprises a computer system configured to drive the first signal and receive the second signal and determine a first updated value for the first potentiometer to obtain a first desired laser output parameter value based on a first known value of the first potentiometer, the second signal, and the first desired laser output parameter value.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
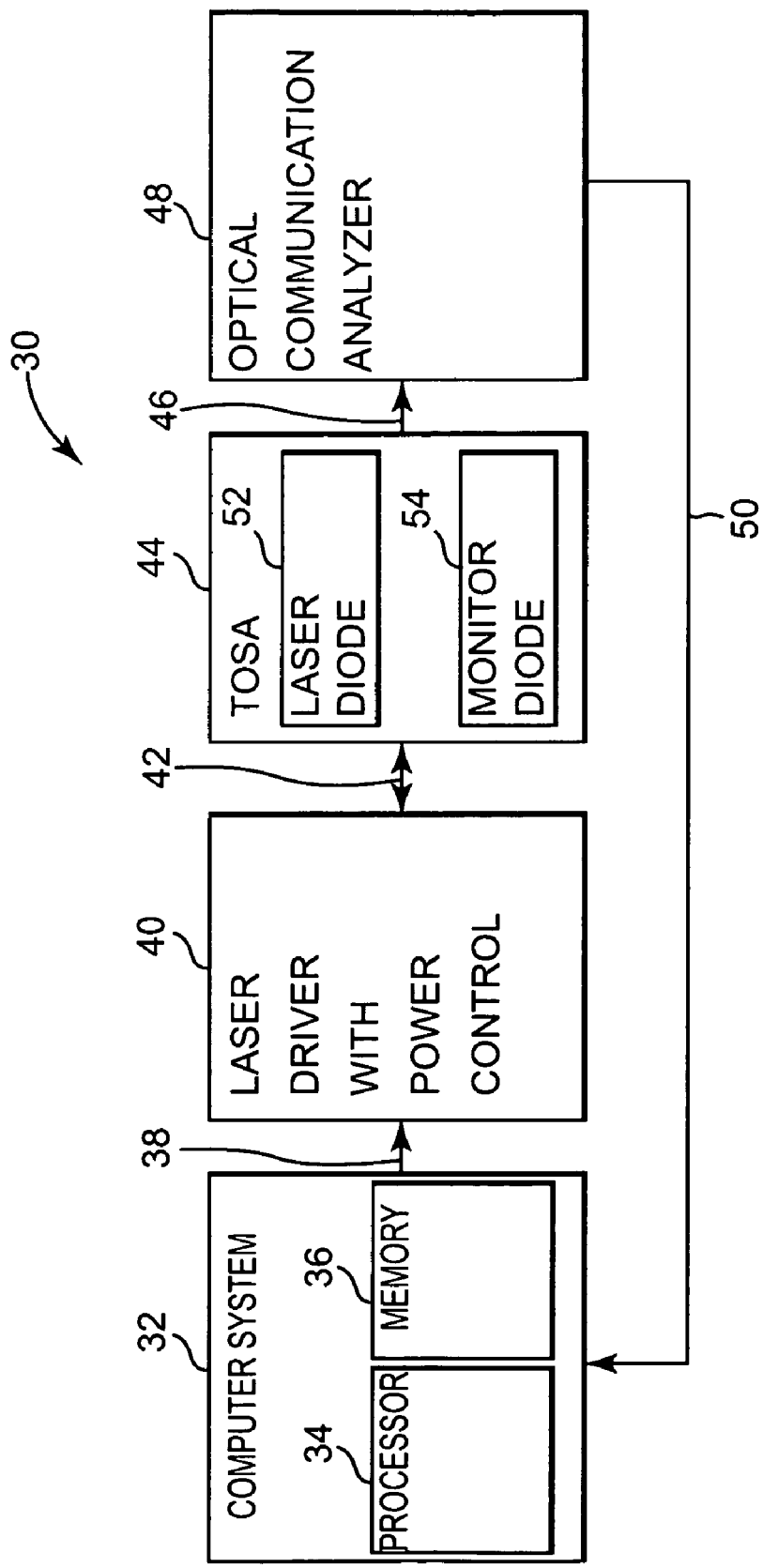
FIG. 1 is a block diagram illustrating one embodiment of a laser diode temperature compensation system.

FIG. 1 is a block diagram illustrating one embodiment of a laser diode temperature compensation system 30. In particular, temperature compensation system 30 compensates for laser parameter changes over temperature of a transceiver optical subassembly (TOSA). Temperature compensation system 30 includes a computer system 32, a laser driver with power control circuit 40, the TOSA 44 for which compensation is being performed, and an optical communication analyzer 48. Computer system 32 includes a processor 34 and a memory 36. TOSA 44 includes a laser diode 52 and a monitor diode 54.

Computer system 32 is electrically coupled to laser driver with power control circuit 40 through path 38. Laser driver with power control circuit 40 is electrically coupled to TOSA 44 through path 42. TOSA 44 is optically coupled to optical communication analyzer 48 through optical path 46. Optical communication analyzer 48 is electrically coupled to computer system 32 through path 50.

Memory 36 can include main memory, such as a random access memory (RAM) or other dynamic storage device. Memory 36 can also include a static storage device, such as a magnetic disk or optical disk. Memory 36 stores information and instructions to be executed by processor 34. In addition, memory 36 stores temperature compensation results for TOSA 44. One or more processors in a multiprocessor arrangement can also be employed to execute a sequence of instructions contained in memory 36. In other embodiments, hard wired circuitry can be used in place of or in combination with software instructions to implement temperature compensation system 30. Thus, embodiments of temperature compensation system 30 are not limited to any specific combination of hardware circuitry and software.

The term "computer readable medium" as used herein refers to any medium that participates in providing instructions to processor 34 for execution. Such a medium can take many forms, including but not limited to, non-volatile media, volatile media, and transmission media. Non-volatile media include, for example optical or magnetic disks. Volatile media includes dynamic memory. Transmission media include coaxial cables, copper wire, and fiber optics. Transmission media can also take the form of acoustic or light waves, such as those generated during radio frequency (RF) and infrared (IR) data communications. Common forms of computer readable media include, for example, a floppy disk, a flexible disk, a hard disk, magnetic tape, any other magnetic mediums, a CD-ROM, DVD, any other optical medium, punch cards, paper tape, any other physical medium with patterns of holes, a RAM, a programmable read-only memory (PROM), an electrical programmable read-only memory (EPROM), an electrically erasable programmable read-only memory (EEPROM), any other memory chip or cartridge, or any other medium from which a computer can read.

Laser driver with power control circuit 40 drives the modulation and bias current of laser diode 52. Monitor diode 54 monitors the optical output of laser diode 52 and outputs a signal indicative of the output to laser driver with power control circuit 40. The currents are controlled by laser driver with power control circuit 40 to provide constant output power of laser diode 52. Laser driver with power control circuit 40 includes two potentiometers. One potentiometer is adjusted based on temperature to control the bias current over varying temperatures of TOSA 44 and the other potentiometer is adjusted based on temperature to control the modulation current over varying temperatures of TOSA 44.

Optical communication analyzer 48 receives the output signal from laser diode 52 over optical path 46 and measures the extinction ratio (ER) and average power ($P_{ave}$) of laser diode 52. The measured values for $P_{ave}$ and ER are passed to computer system 32 on path 50.

In operation, instructions stored in memory 36 or from another computer readable medium are executed by processor 34 to perform temperature compensation for TOSA 44. To begin, the temperature of TOSA 44 is set to a selected temperature by heating or cooling TOSA 44 to the selected temperature using any suitable means, such as a thermoelectric cooler. Once TOSA 44 is at the selected temperature, computer system 32 controls laser driver with power control circuit 40 to provide a bias current and modulation current to TOSA 44.

For setting the bias current of laser diode 52, the potentiometer that controls the bias current is set to an initial value. The laser driver with power control circuit 40 drives laser diode 52, which outputs an optical signal. Optical communication analyzer 48 receives the optical signal and measures the $P_{ave}$ of laser diode 52. The measured $P_{ave}$ is passed to computer system 32. Processor 34 uses the initial value for the potentiometer, the measured $P_{ave}$, and the desired $P_{ave}$ to calculate a new value for the potentiometer that results in the desired average power for laser diode 52 at the selected temperature. This process can be repeated by setting the potentiometer to the calculated value, driving laser diode 52 again, measuring $P_{ave}$, and recalculating the setting for the potentiometer based on the new measured value for $P_{ave}$. Typically, one iteration is required to achieve the desired average power at the selected temperature.

A similar process is used for setting the potentiometer that controls the modulation current. For setting the modulation current of laser diode 52, the potentiometer that controls the modulation current is set to an initial value. The laser driver with power control circuit 40 drives laser diode 52, which outputs an optical signal. Optical communication analyzer 48 receives the optical signal and measures the ER of laser diode 52. The measured ER is passed to computer system 32. Processor 34 uses the initial value for the potentiometer, the measured ER, and the desired ER to calculate a new value for the potentiometer that results in the desired average power for laser diode 52 at the selected temperature. This process can be repeated by setting the potentiometer to the calculated value, driving laser diode 52 again, measuring ER, and recalculating the setting for the potentiometer based on the new measured value for ER. Typically, one iteration is required to achieve the desired extinction ratio at the selected temperature With the potentiometer that controls the bias current set to achieve the desired average power and the potentiometer that controls the modulation current set to achieve the desired extinction ratio at the selected temperature, the temperature of TOSA 44 is changed a few degrees and the process is repeated. The process is repeated at several temperatures within the operating range of TOSA 44. With temperature compensation completed at several temperatures within the operating range of TOSA 44, interpolation is used to generate a curve for the settings for the potentiometer that controls the bias current and to generate a curve for the settings for the potentiometer that controls the modulation current.

With temperature compensation completed, TOSA 44 is installed in a completed transceiver and the temperature compensation curve for the potentiometer that controls the bias current and the temperature compensation curve for the potentiometer that controls the modulation current are stored in a memory of the transceiver. The temperature compensation curves are used to control the transceiver laser driver and power control circuit for the installed TOSA over the operating temperature range of the transceiver.

In another embodiment, TOSA 44 is installed in a completed transceiver and the temperature compensation curve for the bias current is used to select a first thermistor for the transceiver to control the bias current. The temperature compensation curve for the modulation current is used to select a second thermistor for the transceiver to control the modulation current. The first and second thermistors are used in place of the potentiometers and the temperature compensation curves stored in a memory of the transceiver. The first and second thermistors control the transceiver laser driver and power control circuit for the installed TOSA over the operating temperature range of the transceiver.

Figure 2:
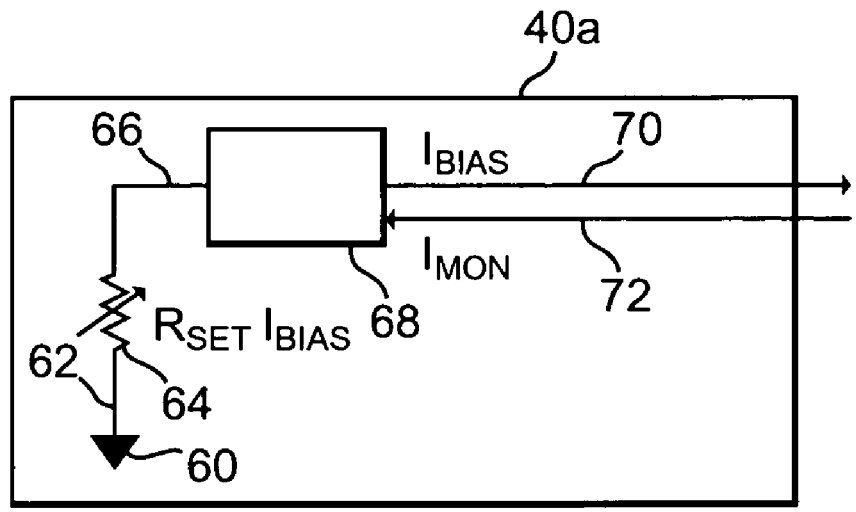
FIG. 2 is a diagram illustrating one embodiment of a portion of a laser driver.

FIG. 2 is a diagram illustrating one embodiment of a portion 40a of laser driver with power control circuit 40. Portion 40a of laser driver with power control circuit 40 includes an integrated circuit 68 and an $R_{setIbias}$ potentiometer 64. $R_{setIbias}$ potentiometer 64 is electrically coupled to a common or ground 60 through path 62 and to integrated circuit 68 through path 66. Integrated circuit 68 outputs the bias current ($I_{bias}$) on path 70 and receives the monitor current ($I_{mon}$) on path 72 from TOSA 44.

$R_{setIbias}$ potentiometer 64 is a mechanical potentiometer or a digital potentiometer. Integrated circuit 68 outputs a bias current that varies based on the setting of $R_{setIbias}$ potentiometer 64.

Bias current ($I_{bias}$) is proportional to the monitor current ($I_{mon}$). $I_{mon}$ is defined as follows:

$$I_{mon} = \frac{V_{bg}}{R_{setIbias}} \qquad \text{Equation I}$$

where $V_{bg}$ is a constant band gap voltage in integrated circuit 68, and $R_{setIbias}$ is the resistance setting of $R_{setIbias}$ potentiometer 64.

Figure 3:
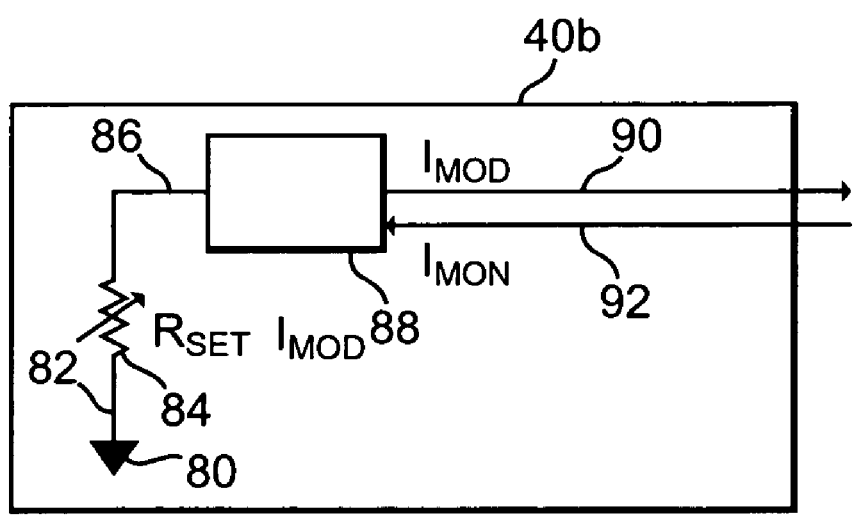
FIG. 3 is a diagram illustrating one embodiment of another portion of a laser driver.

FIG. 3 is a diagram illustrating another portion 40b of laser driver with power control circuit 40. Portion 40b of laser driver with power control circuit 40 includes $R_{setImod}$ potentiometer 84 and integrated circuit 88. $R_{setImod}$ potentiometer 84 is electrically coupled to a common or ground 80 through path 82 and to integrated circuit 88 through path 86. Integrated circuit 88 outputs the modulation current ($I_{mod}$) on path 90 and receives the monitor current ($I_{mon}$) on path 92 from TOSA 44.

$R_{setImod}$ potentiometer 84 is a mechanical potentiometer or a digital potentiometer. Integrated circuit 88 outputs a modulation current that varies based on the setting of $R_{setImod}$ potentiometer 84.

Modulation current ($I_{mod}$) is defined as follows:

$$I_{mod} = \frac{V_{bg}}{R_{setImod}} \quad \text{Equation II}$$

where $V_{bg}$ is a constant band gap voltage in integrated circuit 88, and $R_{setImod}$ is the resistance setting of $R_{setImod}$ potentiometer 84. In one embodiment, integrated circuit 68 and integrated circuit 88 are a single integrated circuit and paths 72 and 92 are a single path.

Figure 4:
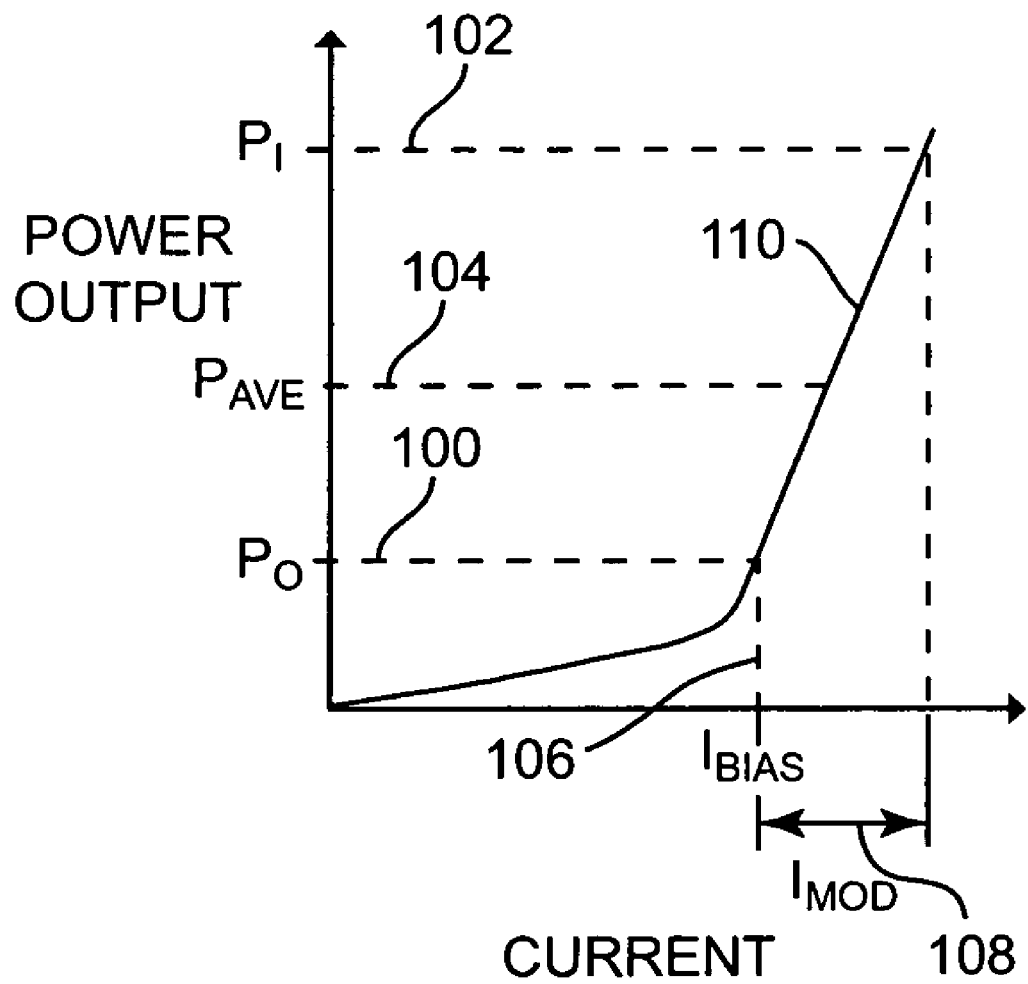
FIG. 4 is a graph illustrating one embodiment of a curve for a laser diode of output power verses current.

FIG. 4 is a graph illustrating one embodiment of a curve 110 of the output power of laser diode 52 versus current. Curve 110 varies as the temperature of laser diode 52 changes. The power output of a logic high ($P_1$) from laser diode 52 is indicated at 102. The power output of a logic low ($P_0$) from laser diode 52 is indicated at 100. The average power ($P_{ave}$) output from laser diode 52 is indicated at 104. The bias current of laser diode 52 is indicated at 106 and the modulation current of laser diode 52 is indicated at 108. The modulation current is the difference between the current at a logic high, $P_1$ and a logic low, $P_0$. The bias current is defined as the current at a logic low, $P_0$.

Average power ($P_{ave}$) is defined as follows:

$$P_{ave} = \frac{P_0 P_1}{2} \quad \text{Equation III}$$

where $P_0$ is the power output of a logic low optical signal and $P_1$ is the power output of a logic high optical signal.

Extinction ratio (ER) is defined as follows:

$$ER = \frac{P_1}{P_0} \quad \text{Equation IV}$$

Optical modulation amplitude (OMA) is defined as follows:

$$OMA = I_{mod} \cdot \eta \cdot k_2 \quad \text{Equation V}$$

where $\eta$ is the slope of curve 110 and $k_2$ a is constant representing coupling efficiency losses and other losses.

OMA is also defined as follows:

$$OMA = 2 \cdot P_{ave} \cdot \frac{ER - 1}{ER + 1} \quad \text{Equation VI}$$

Figure 5:
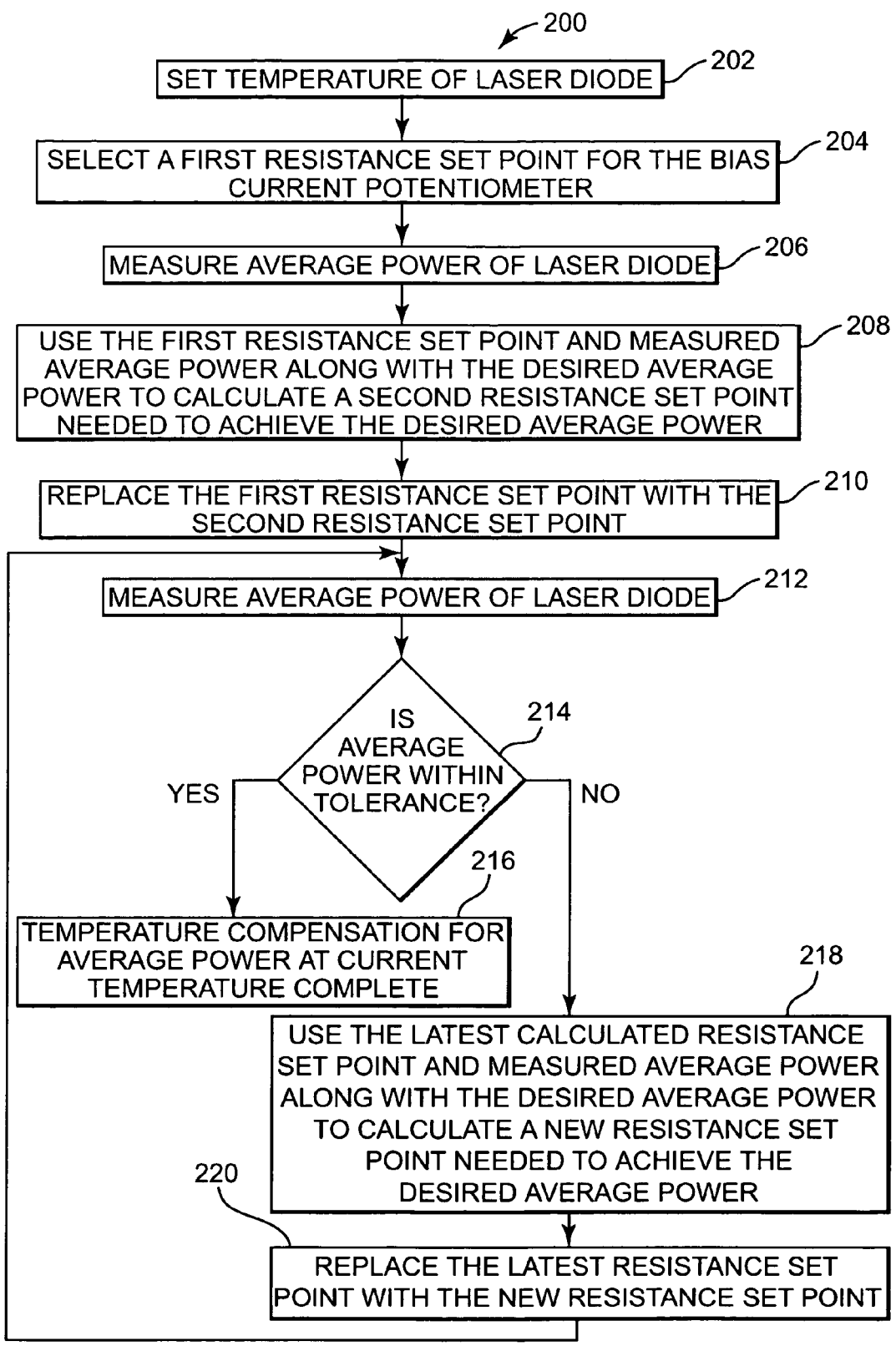
FIG. 5 is a flow diagram illustrating one embodiment of a method for setting the value of a potentiometer that controls the bias current to achieve a desired average power at a selected temperature.

FIG. 5 is a flow diagram illustrating one embodiment of a method 200 for setting $R_{setIbias}$ potentiometer 64 to achieve a desired average power at a selected temperature. At 202, the temperature of TOSA 44 is set to a selected temperature. At 204, computer system 32 sets $R_{setIbias}$ potentiometer 64 to a first resistance set point. At 206, computer system 32 drives laser diode 52, which outputs an optical signal. Optical communication analyzer 48 receives the optical signal and measures the average power of laser diode 52. At 208, the resistance set point, the measured average power, and the desired average power are used to calculate a new resistance set point needed to achieve the desired average power. At 210, the first resistance set point of $R_{setIbias}$ potentiometer 64 is replaced with the newly calculated resistance set point.

At 212, the average power of laser diode 52 is again measured. At 214, the measured average power is compared to the desired average power. If the measured average power is within tolerance, temperature compensation at the current temperature for average power is complete at 216. If the average power is not within tolerance, then at 218 the latest calculated resistance set point, the measured average power, and the desired average power are used to calculate a new resistance set point needed to achieve the desired average power. At 220, the latest resistance set point calculated replaces the previous resistance set point for $R_{setIbias}$ potentiometer 64. Control returns to 212 where average power is measured again. The process continues until average power is within tolerance at the selected temperature. Typically, one iteration is required.

In one embodiment, blocks 208 and 218, in which the resistance set point and the measured average power along with the desired average power are used to calculate a new resistance set point needed to achieve the desired average power, the new resistance set point is calculated as shown in the following equations VII through XVII.

$I_{mon}$ is defined in terms of average power ($P_{ave}$) as follows:

$$I_{mon} = c \cdot P_{ave} \quad \text{Equation VII}$$

where c is a constant. By combining equations I and VIII, the following relationship is formed. Because $V_{bg}$ is a constant, another constant k is used to replace $V_{bg}$ to simplify the equation.

$$k \cdot c \cdot P_{ave} = \frac{1}{R_{estIbias}} \quad \text{Equation VIII}$$

Solving for $R_{setIbias}$ results in the following:

$$R_{1setIbias} = \frac{1}{k \cdot c \cdot P_{1ave}} \quad \text{Equation IX}$$

where $R_{1setIbias}$ is the known initial setting or first resistance set point of $R_{setIbias}$ potentiometer 64 and $P_{2ave}$ is the measured average power at the current temperature and at the $R_{1setIbias}$ setting.

Similarly, the second setting or second resistance set point for $R_{setIbias}$ potentiometer 64 is defined as follows:

$$R_{2setIbias} = \frac{1}{k \cdot c \cdot P_{2ave}} \quad \text{Equation X}$$

where $R_{2setIbias}$ is the unknown setting for $R_{setIbias}$ potentiometer 64 and $P_{2ave}$ is the desired average power at the current temperature.

Combining equations IX and X results in the following:

$$\frac{R_{2setIbias}}{R_{1setIbias}} = \frac{k \cdot c \cdot P_{1ave}}{k \cdot c \cdot P_{2ave}} \qquad \text{Equation XI}$$

Reducing equation XI and solving for $R_{2setIbias}$ results in the following:

$$R_{2setIbias} = \frac{P_{1ave}}{P_{2ave}} \cdot R_{1setIbias} \qquad \text{Equation XII}$$

In one embodiment, $R_{setIbias}$ potentiometer 64 is a 50 k$\Omega$ digital resistor with 256 positions represented by:

$$R_{setIbias} = 196n + R_w \qquad \text{Equation XIII}$$

where n is the wiper setting of $R_{setIbias}$ potentiometer 64 and $R_w$ is the wiper or minimum resistance of $R_{setIbias}$ potentiometer 64. $R_{1setIbias}$ and $R_{2setIbias}$ are represented respectively as follows:

$$R_{1setIbias} = 196n_1 + R_w \qquad \text{Equation XIV}$$

$$R_{2setIbias} = 196n_2 + R_w \qquad \text{Equation XV}$$

where $n_1$ is the known position or first resistance set point of $R_{setIbias}$ potentiometer 64 and $n_2$ is the unknown setting or second resistance set point.

Substituting equations XIV and XV into equation XII results in the following:

$$196n_2 + R_w = \frac{P_{1ave}}{P_{2ave}} \cdot (196n_1 + R_w) \qquad \text{Equation XVI}$$

Solving for $n_2$ at the current temperature results in the following:

$$n_2 = \frac{\left(\frac{P_{1ave}}{P_{2ave}} \cdot (196n_1 + R_w)\right) - R_w}{196} \qquad \text{Equation XVII}$$

Figure 6:
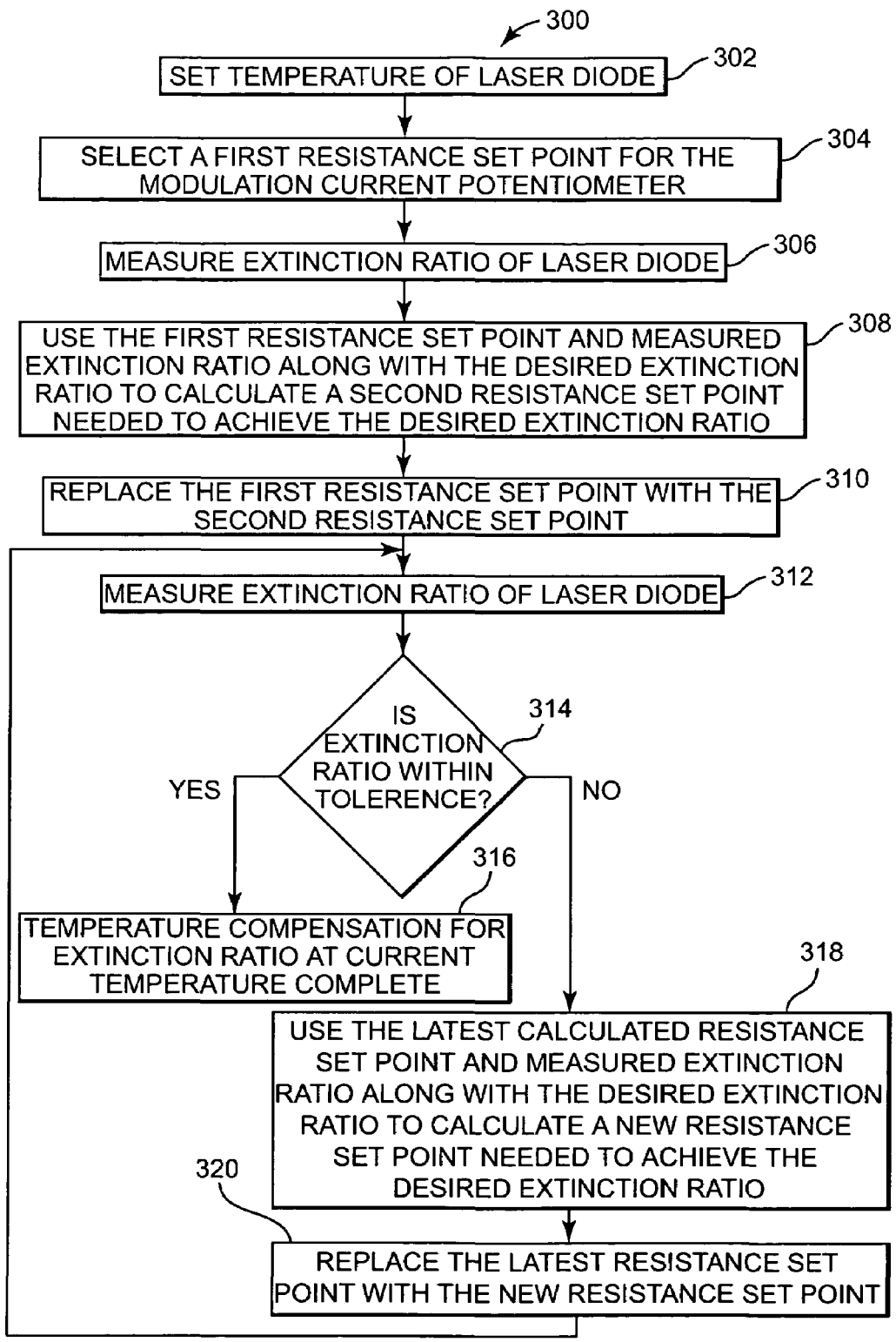
FIG. 6 is a flow diagram illustrating one embodiment of a method for setting the value of a potentiometer that controls the modulation current to achieve a desired extinction ratio at a selected temperature.

FIG. 6 is a flow diagram illustrating one embodiment of a method 300 for setting $R_{setImod}$ potentiometer 84 to achieve a desired extinction ratio at a selected temperature. At 302, the temperature of TOSA 44 is set to a selected temperature. At 304, computer system 32 sets $R_{setImod}$ potentiometer 84 to a first resistance set point. At 306, computer system 32 drives the laser diode 52, which outputs an optical signal. Optical communication analyzer 48 receives the optical signal and measures the ER of laser diode 52. At 308, the resistance set point, the measured ER, and the desired ER are used to calculate a new resistance set point needed to achieve the desired ER. At 310, the first selected resistance set point of $R_{setImod}$ potentiometer 84 is replaced with the newly calculated resistance set point.

At 312, the ER of laser diode 52 is again measured. At 314, the measured ER is compared to the desired ER. If the measured ER is within tolerance, temperature compensation at the current temperature for ER is complete at 316. If the ER is not within tolerance, then at 318 the latest calculated resistance set point, the measured ER, and the desired ER are used to calculate a new resistance set point needed to achieve the desired ER. At 320, the latest resistance set point calculated replaces the previous resistance set point for $R_{setImod}$ potentiometer 84. Control returns to 312 where ER is measured again. The process continues until ER is within tolerance at the selected temperature. Typically, one iteration is required.

In one embodiment, at block 308 and 318, in which the resistance set point and the measured ER along with the desired ER are used to calculate a new resistance set point needed to achieve the desired ER, the new resistance set point is calculated as shown in the following equations XVIII through XXX.

By combining equations II and V, the following relationship is formed.

$$\frac{V_{bg}}{R_{setImod}} = \frac{OMA}{\eta \cdot k_2} \qquad \text{Equation XVIII}$$

Because $V_{bg}$ and $k_2$ are both constants, another constant K is used to replace both $V_{bg}$ and $k_2$ to simplify the equation resulting in the following:

$$\frac{1}{R_{setImod}} = \frac{OMA}{\eta} K \qquad \text{Equation XIX}$$

Solving for K yields the following:

$$K = \frac{\eta}{OMA} \cdot \frac{1}{R_{setImod}} \qquad \text{Equation XX}$$

Equations XIX and XX are combined to solve for an unkown value or second resistance set point for $R_{setImod}$ potentiometer 84 based on an initial known value or first resistance set point and measured OMA as follows:

$$\frac{1}{R_{2setImod}} = \frac{OMA_2}{\eta_1}\left[\frac{\eta_1}{OMA_1} \cdot \frac{1}{R_{1setImod}}\right] \qquad \text{Equation XXI}$$

where $OMA_1$ is the measured OMA and $\eta_1$ is the slope at a known $R_{setImod}$ potentiometer 84 setting of $R_{1setImod}$. $R_{2setImod}$ is the unknown setting or second resistance set point of $R_{setImod}$ potentiometer 84 to achieve a desired $OMA_2$. Equation XXI reduces to the following:

$$\frac{R_{1setImod}}{R_{2setImod}} = \frac{OMA_2}{OMA_1} \qquad \text{Equation XXII}$$

To convert extinction ratio in dB to watts, the following equation is used.

$$ER = 10^{ERdB/10} \qquad \text{Equation XXIII}$$

Combining equations VI and XXII results in the following:

$$\frac{R_{1setImod}}{R_{2setImod}} = \frac{2 \cdot P_{ave} \cdot \frac{ER_2 - 1}{ER_2 + 1}}{2 \cdot P_{ave} \cdot \frac{ER_1 - 1}{ER_1 + 1}} \quad \text{Equation XXIV}$$

where $ER_1$ is the measured extinction ratio using $R_{1setImod}$ and $ER_2$ is the desired extinction ratio.

Combining and simplifying equations XXIII and XXIV results in the following:

$$\frac{R_{1setImod}}{R_{2setImod}} = \frac{10^{ERdB_2/10} - 1}{10^{ERdB_2/10} + 1} \cdot \frac{10^{ERdB_1/10} + 1}{10^{ERdB_1/10} - 1} \quad \text{Equation XXV}$$

where $ERdB_1$ is the measured extinction ratio in dB using $R_{1setImod}$ and $ERdB_2$ is the desired extinction ratio in dB.

Solving for $R_{2setImod}$ results in the following:

$$R_{2setImod} = \left(\frac{10^{ERdB_2/10} + 1}{10^{ERdB_2/10} - 1}\right) \cdot \left(\frac{10^{ERdB_1/10} - 1}{10^{ERdB_1/10} + 1}\right) \cdot R_{1setImod} \quad \text{Equation XXVI}$$

In one embodiment, $R_{setImod}$ potentiometer 84 is a 50 kΩ digital resistor with 256 positions represented by:

$$R_{setImod} = 196n + R_w \quad \text{Equation XXVII}$$

where n is the position of $R_{setImod}$ potentiometer 84 and $R_w$ is the wiper resistance or minimum resistance of $R_{setImod}$ potentiometer 84.

$R_{1setImod}$ and $R_{2setImod}$ are represented respectively as follows:

$$R_{1setImod} = 196n_1 + R_w \quad \text{Equation XXVIII}$$

$$R_{2setImod} = 196n_2 + R_w \quad \text{Equation XXIX}$$

where $n_1$ is the known position of $R_{setImod}$ potentiometer 84 and $n_2$ is the unknown position of $R_{setImod}$ potentiometer 84 that is to be calculated.

Combining equations XXVI, XXVIII, and XXIX and solving for $n_2$ results in:

$$n_2 = \frac{\left(\frac{10^{ERdB_2/10} + 1}{10^{ERdB_2/10} - 1} \cdot \frac{10^{ERdB_1/10} - 1}{10^{ERdB_1/10} + 1}\right)(196n_1 + R_w) - R_w}{196} \quad \text{Equation XXX}$$

Figure 7:
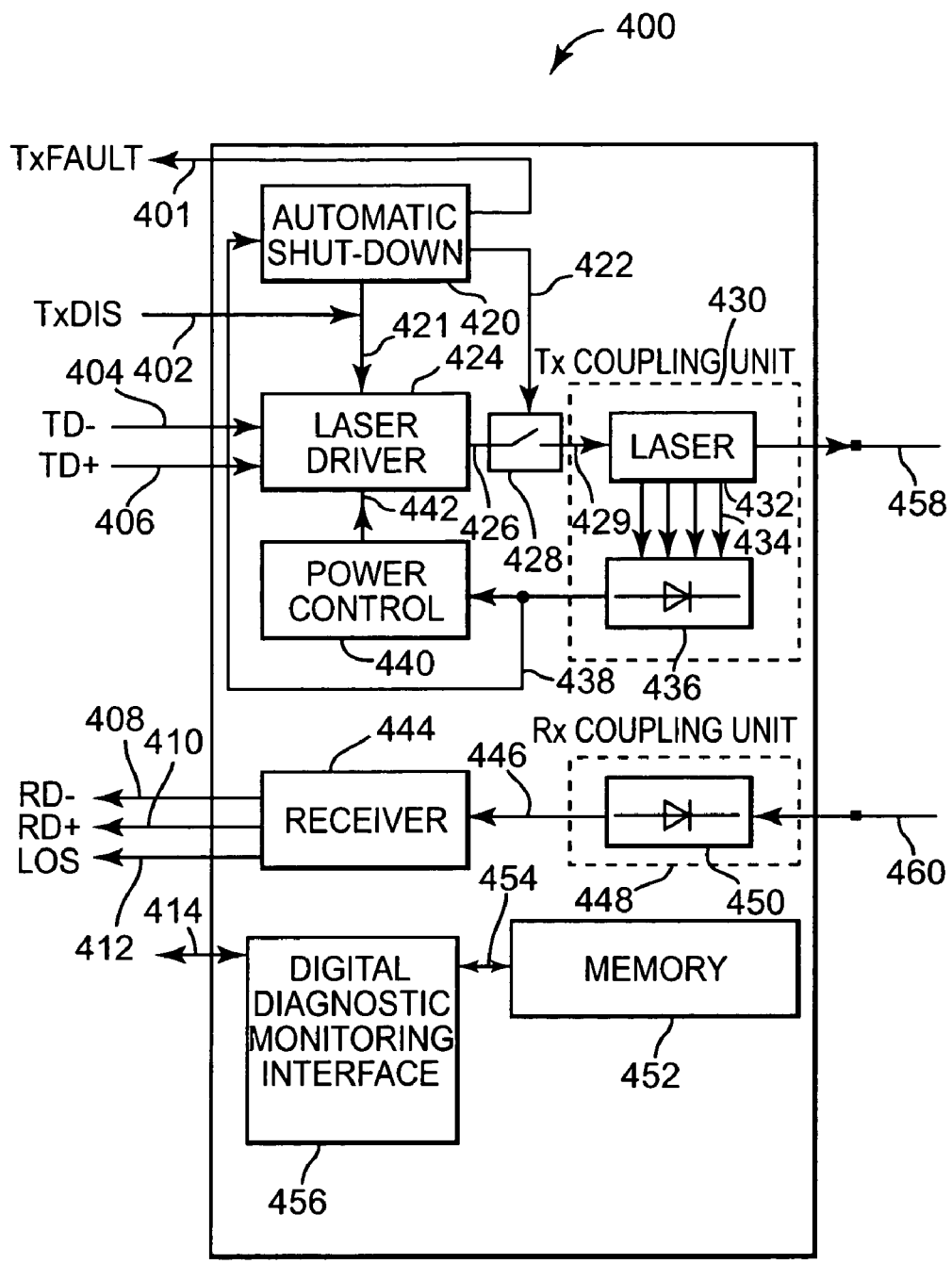
FIG. 7 is a block diagram illustrating one embodiment of a transceiver.

FIG. 7 is a block diagram illustrating one embodiment of a transceiver 400. Transceiver 400 includes an automatic shutdown circuit 420, a laser driver 424, a switch 428, a transmitter (Tx) coupling unit 430, a power control circuit 440, a receiver 444, a receiver (Rx) coupling unit 448, a digital diagnostic monitoring interface 456, and a memory 452. The Rx coupling unit 448 includes a photodiode 450. The Tx coupling unit 430 includes a laser diode 432 and a monitor diode 436.

The automatic shutdown circuit 420, laser driver 424, switch 428, Tx coupling unit 430, and power control circuit 440 are configured as a transmitter. Automatic shutdown circuit 420 is electrically coupled to laser driver 424 through path 421 and to switch 428 through path 422. Laser driver 424 is electrically coupled to switch 428 through path 426 and to power control circuit 440 through path 442. Switch 428 is electrically coupled to laser diode 432 through path 429 and laser diode 432 is optically coupled to monitor diode 436 through optical path 434. Monitor diode 436 is electrically coupled to power control circuit 440 and automatic shut down circuit 420 through path 438. Tx coupling unit 430 is coupled to fiber optic cable 458.

The receiver 444 and Rx coupling unit 448 are configured as a receiver. Receiver 444 is electrically coupled to photodiode 450 through path 446. Rx coupling unit 448 is coupled to a fiber optic cable 460. Digital diagnostic monitoring interface 456 is electrically coupled to memory 452 through path 454.

The host interface for transceiver 400 includes a transmitter fault (Tx Fault) signal line 401, a transmitter disable (TxDis) signal line 402, a transmit data minus (TD−) signal line 404, and a transmit data plus (TD+) signal line 406. In addition, the host interface includes a receive data minus (RD−) signal line 408, a receive data plus (RD+) signal line 410, loss of signal (LOS) line 412, and a host communication line 414. In one embodiment, host communication line 414 includes a serial communication bus or another suitable communication bus.

Transmitter fault signal line 401 is electrically coupled to automatic shutdown circuit 420. Transmitter disable signal line 402 is electrically coupled to automatic shutdown circuit 420 and laser driver 424 through path 421. Transmit data minus signal line 404 and transmit data plus signal line 406 are electrically coupled to laser driver 424. Receive data minus signal line 408, receive data plus signal line 410, and loss of signal line 412 are electrically coupled to receiver 444, and host communication line 414 is electrically coupled to digital diagnostic and monitoring interface 456.

Rx coupling unit 448 mechanically and optically couples transceiver 400 to fiber optic cable 460. An optical signal transmitted by an external device is received by photodiode 450 and converted by photodiode 450 to an electrical signal. The electrical signal is passed to receiver 444 through path 446.

Receiver 444 converts the signal received from photodiode 450 into electrical serial data compatible with low voltage positive emitter coupled compatible logic (LVPECL). The LVPECL compatible electrical serial data is passed to a host through signal lines RD− 408 and RD+ 410. The loss of signal on LOS signal line 412 indicates whether an optical signal is present at Rx coupling unit 448.

Monitoring diode 436 monitors the optical output of laser diode 432 through optical path 434. In one embodiment, monitoring diode 436 is mechanically built into Tx coupling unit 430. Monitoring diode 436 outputs a signal indicative of the output of laser diode 432 through path 438 to automatic shutdown circuit 420 and power control circuit 440.

Laser driver circuit 424 drives the modulation and bias currents of laser diode 432. The currents are controlled by power control circuit 440 to provide constant output power of laser diode 432 over varying temperatures and as the laser diode 432 ages. Power control circuit 440 includes two potentiometers. One potentiometer is adjusted based on temperature to control the bias current over varying temperatures of laser diode 432 and the other potentiometer is adjusted based on temperature to control the modulation current over varying temperatures of laser diode 432. In one embodiment, both potentiometers are digital potentiometers. Power control circuit 440 uses the output of monitor diode 436 as a control signal to prevent the laser power from exceeding operating limits.

In another embodiment, power control circuit 440 includes two thermistors instead of two potentiometers. The resistance of the first thermistor adjusts automatically based on temperature to control the bias current over varying temperatures of laser diode 432 and the resistance of the second thermistor adjusts automatically based on temperature to control the modulation current over varying temperatures of laser diode 432. The first thermistor is selected based on the temperature compensation curve for the bias current and the second thermistor is selected based on the temperature compensation curve for the modulation current.

Tx coupling unit 430 mechanically and optically couples transceiver 400 to fiber optic cable 458. Laser driver 424 receives a LVPECL compatible serial data signal from a host through TD− signal line 404 and TD+ signal line 406 and passes a signal to laser diode 432. Laser diode 432 converts the signal received from laser driver 424 into optical serial data and transmits the optical serial data through fiber optic cable 458.

Shutdown circuit 420 automatically disables laser diode 432 and outputs a fault signal on Tx Fault signal line 401 if shutdown circuit 420 detects a laser fault. By disabling laser diode 432, shutdown circuit 420 provides laser eye safety. Shutdown circuit 420 communicates with switch 428 through path 422 to open or close switch 428 to disable or enable laser diode 432.

In one embodiment, transceiver 400 includes a supervisory circuit for controlling the power supply. The supervisory circuit provides an internal reset signal whenever the supply voltage drops below a reset threshold. In one embodiment, the supervisory circuit keeps the reset signal active for at least 140 ms after the voltage has risen above the reset threshold. During this time, laser diode 432 is inactive.

A host can enable the laser driver 424 by providing a logic low level on TxDis signal line 402. A host can disable the laser driver 424 by providing a logic high level on TxDis signal line 402.

Digital diagnostic monitoring interface 456 continuously monitors transceiver 400 operating parameters. In one embodiment, transceiver 400 features internal calibration. Measurements are taken and transceiver 400 is calibrated over varying operating temperatures and voltages to obtain normal operating parameter ranges for transceiver 400. During operation, digital diagnostic monitoring interface 456 generates diagnostic data that is compared to the normal operating parameter ranges by digitizing internal analog signals monitored by a diagnostic integrated circuit (IC). The diagnostic IC has built in sensors that include alarm and warning thresholds. The threshold values are set during device manufacture and allow the user to determine when a particular value is outside of a normal operating parameter range.

Digital diagnostic monitoring interface 456 outputs alarm and warning flags to a host through host communication line 414. Alarm flags indicate conditions likely to be associated with an inoperational link that requires immediate action. Warning flags indicate conditions outside normal operating ranges, but not necessarily causes of immediate link failures.

Memory 452 is an electrically erasable programmable read-only memory (EEPROM). In other embodiments, other suitable memory types can be used. Memory 452 is used to store the temperature compensation curves for both the potentiometer that controls the bias current and the potentiometer that controls the modulation current. In operation, as the temperature of transceiver 400 varies, the settings for the potentiometers that control the bias current and the modulation current are changed based on the temperature compensation curves. At manufacture of transceiver 400, the temperature compensation curves generated for laser diode 432 are written to memory 452 by a host through path 414, and through digital diagnostic monitoring interface 456 and path 454.

In another embodiment, where thermistors are used in place of the potentiometers, the temperature compensation curves are not stored in memory 452. The thermistors, which are selected based upon the temperature compensation curves, automatically change resistance based on temperature to control the bias current and modulation current.

What is claimed is:

1. A temperature compensation system for a laser, the temperature compensation system comprising:
 a laser driver having a first potentiometer and a second potentiometer, the laser driver configured to provide a first signal to a laser based on a resistance value of the first potentiometer;
 an optical communication analyzer configured to provide a second signal indicative of a first output parameter of the laser;
 the laser driver configured to provide a third signal to the laser based on a resistance value of the second potentiometer;
 the optical communication analyzer configured to provide a fourth signal indicative of a second output parameter of the laser; and
 a computer system configured to drive the first signal and receive the second signal and determine a first updated resistance value for the first potentiometer to obtain a first desired laser output parameter value based on a first known resistance value of the first potentiometer, the second signal, and the first desired laser output parameter value and to drive the third signal and receive the fourth signal and determine a second updated resistance value for the second potentiometer to obtain a second desired laser output parameter value based on a second known resistance value of the second potentiometer, the fourth signal, and the second desired laser output parameter value.

2. The temperature compensation system of claim 1, wherein the first signal comprises a bias current signal and the third signal comprises a modulation current signal.

3. The temperature compensation system of claim 1, wherein the first output parameter of the laser comprises an average power and the second output parameter of the laser comprises an extinction ratio.

4. The temperature compensation system of claim 1, wherein the first desired laser output parameter comprises an average power and the second desired laser output parameter comprises an extinction ratio.

5. A computer system comprising:
 a memory storing a temperature compensation program; and
 a processor, which executes the temperature compensation program instructions to:
   select a first resistance setting for a first potentiometer for controlling a bias current of a laser diode;
   receive a measurement of an average power of the laser diode;
   calculate a second resistance setting for the first potentiometer based on the first resistance setting for the first potentiometer, the measurement of the average power, and a desired average power;

select a third resistance setting for a second potentiometer for controlling a modulation current of the laser diode;

receive a measurement of an extinction ratio of the laser diode; and calculate a fourth resistance setting for the second potentiometer based on the third resistance setting for the second potentiometer, the measurement of the extinction ratio, and a desired extinction ratio.

6. The computer system of claim 5, wherein the processor executes the temperature compensation program instructions to set the temperature of the laser diode to a selected value.

7. The computer system of claim 5, wherein the processor executes the temperature compensation program instructions to store the second setting in the memory.

8. The computer system of claim 5, wherein the processor executes the temperature compensation program instructions to store the fourth setting in the memory.

9. A method for compensating for temperature variations of a laser diode comprising:

selecting a first resistance setting for a first potentiometer for controlling a bias current of a laser diode;

measuring an average power of the laser diode;

calculating a second resistance setting for the first potentiometer based on the first resistance setting for the first potentiometer, the measured average power, and a desired average power;

selecting a third resistance setting for a second potentiometer for controlling a modulation current of the laser diode;

measuring an extinction ratio of the laser diode; and calculating a fourth resistance setting for the second potentiometer based on the third resistance setting for the second potentiometer, the measured extinction ratio, and a desired extinction ratio.

10. The method of claim 9, further comprising:

setting the temperature of the laser diode to a selected value.

11. The method of claim 9, wherein the first potentiometer is a first digital potentiometer and the second potentiometer is a second digital potentiometer.

12. The method of claim 9, further comprising:

installing the laser diode in a transmitter; and storing the second resistance setting for the first potentiometer and the fourth resistance setting for the second potentiometer to a memory of the transmitter.

13. The method of claim 9, further comprising:

installing the laser diode in a transmitter;

selecting a first thermistor of the transmitter based on the second resistance setting for the first potentiometer; and selecting a second thermistor of the transmitter based on the fourth resistance setting for the second potentiometer.

14. The method of claim 9, wherein calculating the fourth resistance setting for the second potentiometer comprises the following equation:

$$R_2 = \left(\frac{10^{ERdB_2/10}+1}{10^{ERdB_2/10}-1}\right) \cdot \left(\frac{10^{ERdB_1/10}-1}{10^{ERdB_1/10}+1}\right) \cdot R_1$$

where $R_2$ is the fourth resistance setting for the second potentiometer, $R_1$ is the third resistance setting for the second potentiometer, $ERdB_2$ is the desired extinction ratio in dB, and $ERdB_1$ is the measured extinction ratio in dB.

15. The method of claim 9, wherein calculating the second resistance setting for the first potentiometer comprises the following equation:

$$R_2 = \frac{P_{1ave}}{P_{2ave}} \cdot R_1$$

where $R_2$ is the second resistance setting for the first potentiometer, $R_1$ is the first resistance setting for the first potentiometer, $P_{2ave}$ is the desired average power, and $P_{1ave}$ is the measured average power.

16. A computer readable medium for use in a computer system comprising:

a computer readable program code means for causing a computer to:

select a first resistance setting for a first potentiometer for controlling a bias current of a laser diode;

receive a measurement of an average power of the laser diode;

calculate a second resistance setting for the first potentiometer based on the first resistance setting for the first potentiometer, the measurement of the average power, and a desired average power;

select a third resistance setting for a second potentiometer for controlling a modulation current of the laser diode;

receive a measurement of an extinction ratio of the laser diode; and calculate a fourth resistance setting for the second potentiometer based upon the third resistance setting for the second potentiometer, the measurement of the extinction ratio, and a desired extinction ratio.

17. The computer readable medium of claim 16, wherein the computer readable program code means comprises code means for causing a computer to:

set the temperature of the laser diode to a desired value.

18. A fiber optic transmitter comprising:

a laser;

a first potentiometer for controlling a bias current of the laser; and a second potentiometer for controlling a modulation current of the laser, wherein a first value of the first potentiometer is set for a specific temperature by:

selecting a second value for the first potentiometer;

measuring an average power of the laser; and calculating the first value for the first potentiometer based on the second value for the first potentiometer, the measured average power, and a desired average power;

and wherein a third value of the second potentiometer is set for the specific temperature by:

selecting a fourth value for the second potentiometer;

measuring an extinction ratio of the laser; and calculating the third value for the second potentiometer based on the fourth value for the second potentiometer, the measured extinction ratio, and a desired extinction ratio.

19. The fiber optic transmitter of claim 18, wherein the first potentiometer is a first mechanical potentiometer and the second potentiometer is a second mechanical potentiometer.

20. The fiber optic transmitter of claim 18, wherein the first potentiometer is a first digital potentiometer and the second potentiometer is a second digital potentiometer.

21. The fiber optic transmitter of claim 20, wherein a first position of the first digital potentiometer is stored in a memory of a transmitter and a second position of the second digital potentiometer is stored in the memory of the transmitter.

22. The fiber optic transmitter of claim 18, wherein the first value of the first potentiometer is stored in a memory of a transmitter and the third value of the second potentiometer is stored in the memory of the transmitter.

23. The fiber optic transmitter of claim 22, wherein the memory is an electrically erasable programmable read-only memory.

24. The fiber optic transmitter of claim 18, wherein the laser is a laser diode.

* * * * *